United States Patent
Fan

(10) Patent No.: US 7,696,618 B2
(45) Date of Patent: Apr. 13, 2010

(54) POP (PACKAGE-ON-PACKAGE) SEMICONDUCTOR DEVICE

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 371 days.

(21) Appl. No.: 11/984,782

(22) Filed: Nov. 21, 2007

(65) Prior Publication Data

US 2009/0127687 A1      May 21, 2009

(51) Int. Cl.
*H01L 23/02* (2006.01)

(52) U.S. Cl. ................ 257/686; 257/777; 257/E23.085

(58) Field of Classification Search ................ 257/686, 257/690, 737, 777, 787, E23.085; 438/109, 438/112, 124

See application file for complete search history.

(56) References Cited

U.S. PATENT DOCUMENTS 7,250,675 B2 * 7/2007 Fasano et al. ............... 257/723

* cited by examiner

*Primary Examiner*—Quoc D Hoang
(74) *Attorney, Agent, or Firm*—Muncy, Geissler, Olds & Lowe, PLLC

(57) ABSTRACT

A semiconductor device having package-on-package (POP) configuration, primarily comprises a plurality of vertically stacked semiconductor packages and a plurality of electrical connecting components such as solder paste to electrically connect the external terminals of the semiconductor packages such as external leads of leadframes. Each semiconductor package has an encapsulant to encapsulate at least a chip where the encapsulant is movable with respect to the electrical connecting components to absorb the stresses between the vertically stacked semiconductor packages. In one embodiment, a stress-releasing layer is interposed between the vertically stacked semiconductor packages.

13 Claims, 3 Drawing Sheets

POP (PACKAGE-ON-PACKAGE) SEMICONDUCTOR DEVICE

FIELD OF THE INVENTION

The present invention relates to a semiconductor device having package-on-package (POP) configuration, especially to a semiconductor device having soldering points at external terminals of leadframes between the stacked semiconductor packages.

BACKGROUND OF THE INVENTION

In the recent years, more high-tech electronic devices offer lighter, thinner, and smaller features with friendly operation and multiple functions. In order to meet the requirements of smaller footprints with higher densities, 3D stacking technologies are developed such as POP (Package-On-Package) and DOD (Die-On-Die). One of the POP semiconductor devices is to vertically stack a plurality of leadframe-based semiconductor packages together. The leadframe-based stackable packages for POP using leadframes as chip carriers have the lowest overall cost where the external leads extending from the sides of the encapsulants are vertically formed and soldered together to achieve electrical connections. However, the soldered joints between the external leads are vulnerable to break due to thermal stress of CTE mismatch during operations leading to electrical open, or due to mechanical stress of shock, vibration, bending, or drop.

As shown in FIG. 1 and FIG. 2, a conventional leadframed-based POP semiconductor device 100 primarily comprises a first semiconductor package 110 and at least a second semiconductor package 120 stacked above the first semiconductor package 110. The first semiconductor package 110 and the second semiconductor package 120 are leadframe-based packages for flash memory assembly or DDR memory assembly to increase memory capacities or to add more functions. The first semiconductor package 110 comprises a first encapsulant 111, a first chip 112, and a plurality of first external leads 113 (parts of a leadframe) where the first external leads 113 are configured for mounting to a printed circuit board 140 by solder paste 150. The related leadframe-based packages are TSOP (Thin Small Outline Package), QFP (Quad Flat Package), TQFP (Thin QFP), etc.

The second semiconductor package 120 comprises a second encapsulant 121, a second chip 122 inside the second encapsulant 121, and a plurality of second external leads 123 (parts of another leadframe) where the second external leads 123 of the second semiconductor package 120 are extended and exposed from the sides of the second encapsulant 121 and are formed vertically approximately. Conventionally, the second external leads 123 are approximately perpendicular to the marking surface of the second encapsulant 121 and are soldered to the soldering shoulders of the first external leads 113 of the first semiconductor package 110 by soldering materials 130 such as solder paste. Since the soldered joints, where the soldering materials 130 are disposed, between the first external leads 113 and the second external leads 123 are individually formed, therefore, the soldered joints will easily break during TCT (Temperature Cycling Test). After FA (Failure Analysis), the breaks of the soldered joints between the first external leads 113 and the second external leads 123 are due to mismatch of CTE (Coefficient of Temperature Expansion) between the first semiconductor packages 110 and the second semiconductor package 120. Since different material suppliers with different material models will have different material properties, for example, the CTE of the first encapsulant 111 of the first semiconductor package 110 and the second encapsulant 121 of the second semiconductor package 120 are 10 ppm/° C. when below Tg (Glass transition temperature) and 36 ppm/° C. when above Tg where the normal Tg of EMC encapsulant is around 120° C. However, the materials of normal leadframes such as the first external leads 113 and the second external leads 123 are metal or alloy such as Alloy 42 where the CTE is around 4.3 ppm/° C. There is a difference between the CTE of the leadframe such as Alloy 42 and the ones of the encapsulants 111 and 121. When the temperature of the conventional leadframed-based POP semiconductor device 100 becomes higher due to operation, the volume expansion of the first encapsulant 111 and the second encapsulant 121 will be much larger than the corresponding ones of the leadframes, i.e., the first external leads 113 and the second external leads 123, where the expansion differences due to higher temperatures will induce stresses at the second external leads 123 by close contacts between the first encapsulant 111 and the second encapsulant 121, as shown in FIG. 1. Therefore, the soldered joints of the second external leads 123 will experience tensile stresses, especially the second external leads 123 located at the edges of the second semiconductor package 120 leading to soldering breaks. Besides, mechanical stress from ex: shock, vibration, bending, or drop will also cause the soldering points crack easily.

SUMMARY OF THE INVENTION

The main purpose of the present invention is to provide a semiconductor device having package-on-package (POP) configuration where the encapsulants of the semiconductor packages are movable with respect to each other to disperse the stresses exerted on the soldering joints between the external leads to avoid the breaks of soldering joints due to CTE mismatching between different package materials, or due to mechanical stress.

The second purpose of the present invention is to provide a semiconductor device having POP configuration to absorb the stresses exerted on the external leads due to CTE mismatching between different package materials, or due to mechanical stress.

The third purpose of the present invention is to provide a semiconductor device having POP configuration to enhance heat dissipation between the stacked semiconductor packages and to reduce thermal stresses by keeping uniform temperature distributions between the stacked semiconductor packages under high temperature environments.

According to the present invention, a semiconductor device having POP configuration, primarily comprises a first semiconductor package, at least a second semiconductor package, and soldering materials. The first semiconductor package includes a first encapsulant, at least a first chip encapsulated inside the first encapsulant, and a plurality of first external leads of a leadframe where the first external leads are extended and exposed from side(s) of the first encapsulant. The second semiconductor package is disposed above the first semiconductor package. The second semiconductor package includes a second encapsulant, at least a second chip encapsulated inside the second encapsulant, and a plurality of second external leads of a leadframe where the second external leads are extended and exposed from side(s) of the second encapsulant. The second external leads are soldered to the corresponding first external leads by the soldering materials. Moreover, the second encapsulant has a bottom surface movable with respect to the soldering materials on the second external leads and with respect to a top surface of the first encapsulant.

With the same concept, another semiconductor device having POP configuration is revealed in the present invention, comprising a first semiconductor package and at least a second semiconductor package. The first semiconductor package includes a first chip and a plurality of first external terminals where the first external terminals are exposed from the first chip. The second semiconductor package is disposed above the first semiconductor package. The second semiconductor package includes a second chip and a plurality of second external terminals where the second external terminals are exposed from the second chip. The second external terminals are electrically connected to the first external terminals by a plurality of electrical connecting components where a flexible gap is formed between the first semiconductor package and the second semiconductor package so that the second chip is movable with respect to the electrical connecting components.

The semiconductor device mentioned above further comprises a stress-releasing layer formed between the first semiconductor package and the second semiconductor package where the lower surface of the stress-releasing layer is attached to the first semiconductor package and the upper surface of the stress-releasing layer is attached to the second semiconductor package. The stress-releasing layer is a low-modulus material to absorb the stresses between the first encapsulant and the second encapsulant. Preferably, the stress-releasing layer has a high thermal-conductivity.

DETAIL DESCRIPTION OF THE INVENTION

Please refer to the attached drawings, the present invention will be described by means of embodiment(s) below.

Figure 1:
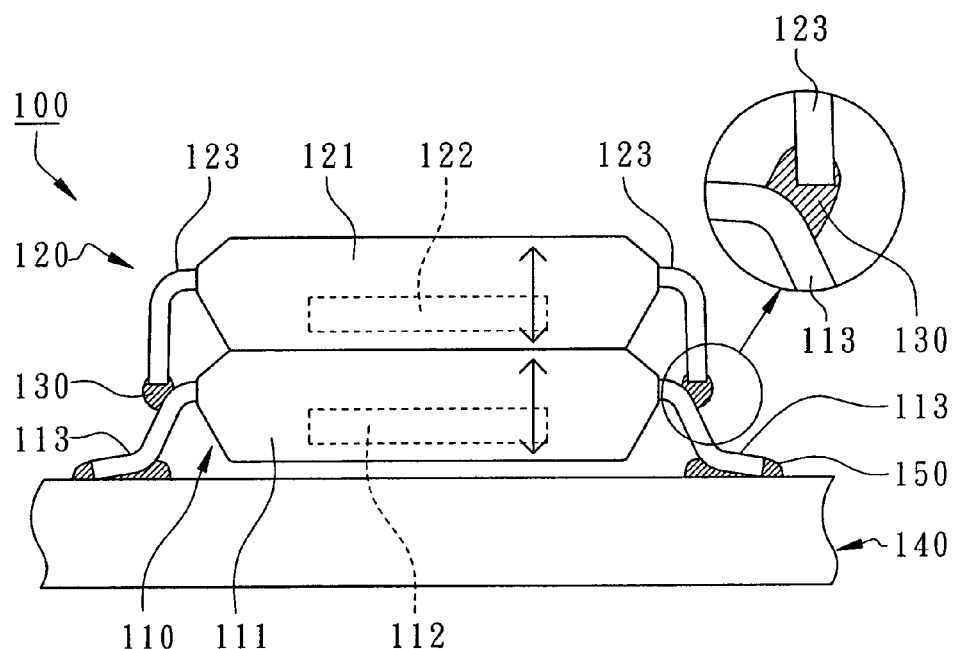
FIG. 1 shows a front view of a conventional leadframe-based POP semiconductor device.
Figure 2:
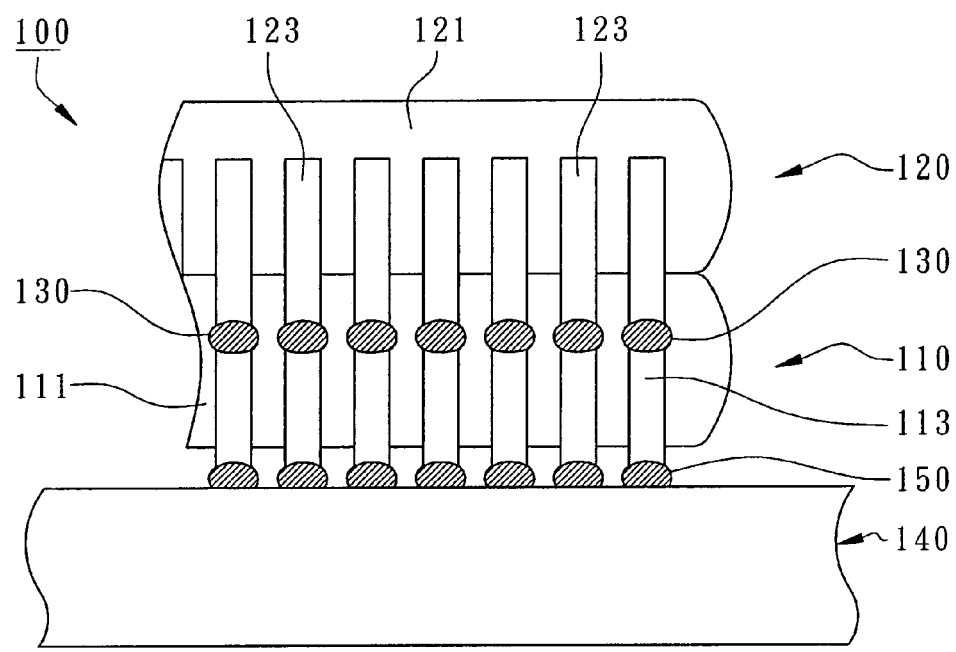
FIG. 2 shows a partial side view of the conventional leadframe-based POP semiconductor device.
Figure 3:
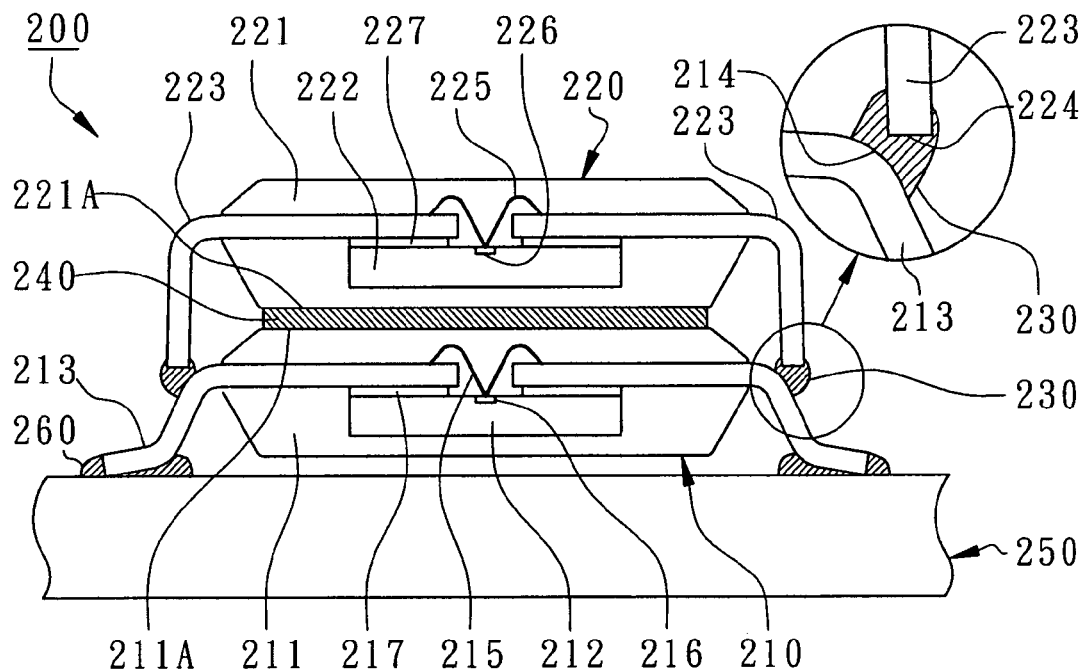
FIG. 3 shows a cross-sectional view of a semiconductor device having POP configuration according to the first embodiment of the present invention.
Figure 4:
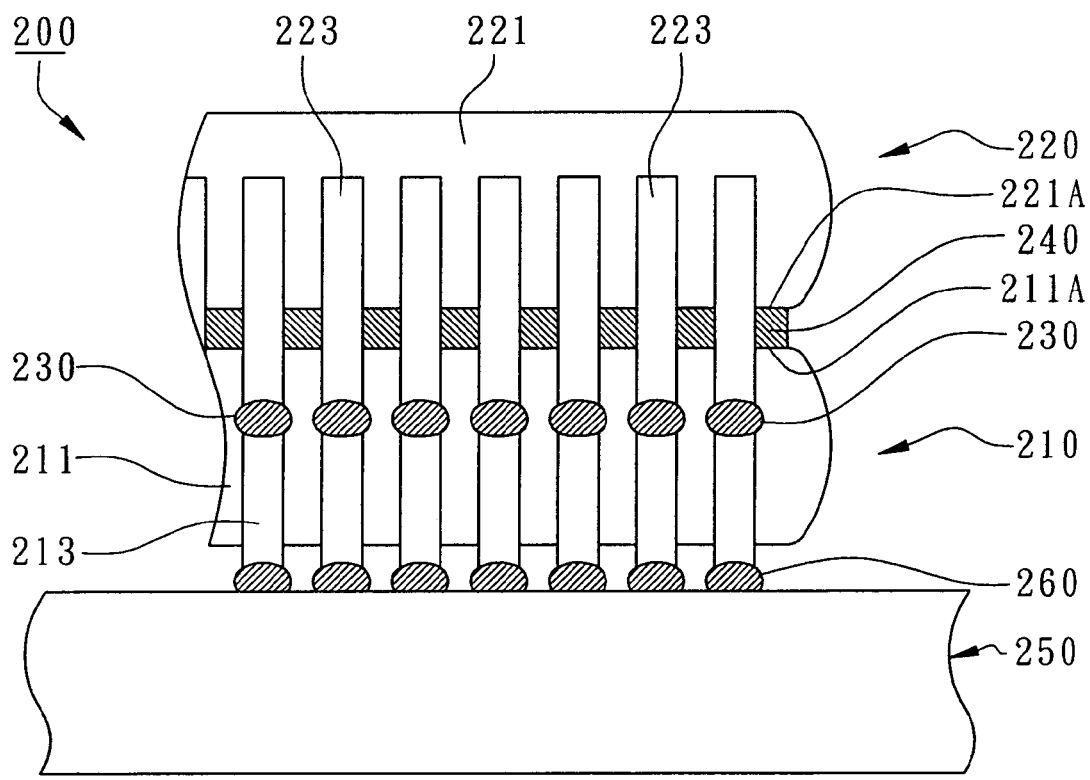
FIG. 4 shows a partial side view of the semiconductor device according to the first embodiment of the present invention.

As shown in FIG. 3 and FIG. 4, a semiconductor device 200 having POP configuration according to the first embodiment of the present invention is illustrated, where TSOP is a specific package for the present invention but TSOP with die pad or FBGA also can be implemented.

The semiconductor device 200 primarily comprises a first semiconductor package 210, at least a second semiconductor package 220 and soldering materials 230. The first semiconductor package 210 and the second semiconductor package 220 can be single-chip packages or multiple-chip packages. As shown in FIG. 3, in the present embodiment, the first semiconductor package 210 and the second semiconductor package 220 are single-chip TSOP. The first semiconductor package 210 includes a first encapsulant 211, at least a first chip 212 encapsulated inside the first encapsulant 211, and a plurality of external leads 213 of a leadframe. A plurality of first bonding pads 216 are disposed on the active surface of the first chip 212. The active surface of the first chip 212 is attached to the lower surfaces of the encapsulated sections of the first external leads 213 by die-attaching materials 217. The first bonding pads 216 of the first chip 212 are electrically connected to the upper surfaces of the encapsulated sections of the first external leads 213 by a plurality of first bonding wires 215. The first chip 212, the first bonding wires 215, and the encapsulated sections of the first external leads 213 are then encapsulated by the first encapsulant 211 during encapsulation processes such as transfer molding. The first external leads 213 are extended and exposed from the sides of the first encapsulant 211 as the first external terminals for the first semiconductor package 210. In the present embodiment, the first external leads 213 are gull leads for SMT mounting to a printed circuit board 250 by solder paste 260 where the printed circuit board 250 may be mother boards of computer, printed circuit boards for memory modules, substrates for display cards, substrates for memory cards, or communication boards for cellular phones, etc.

The second semiconductor package 220 is disposed above the first semiconductor package 210 to achieve POP stacked assembly of multiple TSOP's. The second semiconductor package 220 includes a second encapsulant 221, at least a second chip 222 encapsulated inside the second encapsulant 221, and a plurality of second external leads 223 of a leadframe where the second external leads 223 are extended and exposed from the sides of the second encapsulant 221 as the external terminals for the second semiconductor package 220. The cut ends 224 of the second external leads 223 are soldered to the lead-shoulder sections 214 of the first external leads 213 by soldering materials 230 as shown in the enlarged figure in FIG. 3. In different embodiments, the inner surfaces adjacent to the cut ends 224 of the second external leads 223 can also be used as soldering sections.

As shown in FIG. 3, in the present embedment, the second semiconductor package 220 further comprises at least a die-attaching material 227 and a plurality of second bonding wires 225. The second chip 222 is attached to the second external leads 223 or the die pad, not shown in the figure, by the die-attaching material 227. The second bonding pads 226 of the second chip 222 are electrically connected to the corresponding external leads 223 by the second bonding wires 225. Except the external leads 223 extended from the sides of the second encapsulant 221, the package types of the second semiconductor package 220 can be the same or not the same as the first semiconductor package 210.

Normally the first chip 212 and the second chip 222 are memory chips such as flash or DRAM to increase the memory capacities without increasing package footprints.

The first encapsulant 211 and the second encapsulant 222 are Epoxy Molding Compound (EMC) to individually encapsulate the first chip 212 and the second chip 222.

Furthermore, a plurality of cut ends 224 or a plurality of inner surfaces adjacent to the cut ends 224 of the second external leads 223 are soldered to the lead-shoulder sections 214 of the corresponding first external leads 213 by the soldering materials 230 to electrically connect the first external leads 213 to the second external leads 223. The soldering materials 230 can be meltable metal materials such as tin-lead solders or lead-free solders.

Most important of all, the second encapsulant 221 has a bottom 221A which is movable with respect to the soldering materials 230 on the second external leads 223 and a top 211A of the first encapsulant 211 to disperse the stresses exerted between the stacked semiconductor packages 210 and 220. A more specific embodiment is shown in FIG. 3 and FIG. 4. The semiconductor device 200 may further comprise a stress-releasing layer 240 disposed between the first semiconductor package 210 and the second semiconductor package 220 where the lower surface of the stress-releasing layer 240 is attached to the top 211A of the first encapsulant 211 and the upper surface of the stress-releasing layer 240 is attached to the bottom 221A of the second encapsulant 221. To be more specific, the stress-releasing layer 240 is made of low modulus material to form a flexible gap between the encapsulants 211 and 221, which is selected from a group consisting of silicon rubber, epoxy, and polyimide to absorb the stresses between the first encapsulant 211 and the second encapsulant 221, to disperse the stresses exerted on the soldering joints (where the soldering materials 230 have been disposed) between the external leads 213 and 223, and to avoid the breaks of the soldering joints to enhance the reliability of the POP semiconductor device 200 including the resistance to impact, vibration, bending, dropping, TCT (Temperature cycle test), and TST (Thermal shock test). The stresses are mainly caused by the CTE mismatch among the external leads 213 and 223 of the leadframes, the chips 212 and 222, and the encapsulants 211 and 221, or come from mechanical stress such as shock, drop, vibration or bending effects.

To be more specific, the stress-releasing layer 240 has a high thermal conductivity, which is equal to or higher than the ones of the first encapsulant 211 and the second encapsulant 221 to enhance heat dissipation and to evenly disperse the heat between the first semiconductor package 210 and the second semiconductor package 220.

Figure 5:
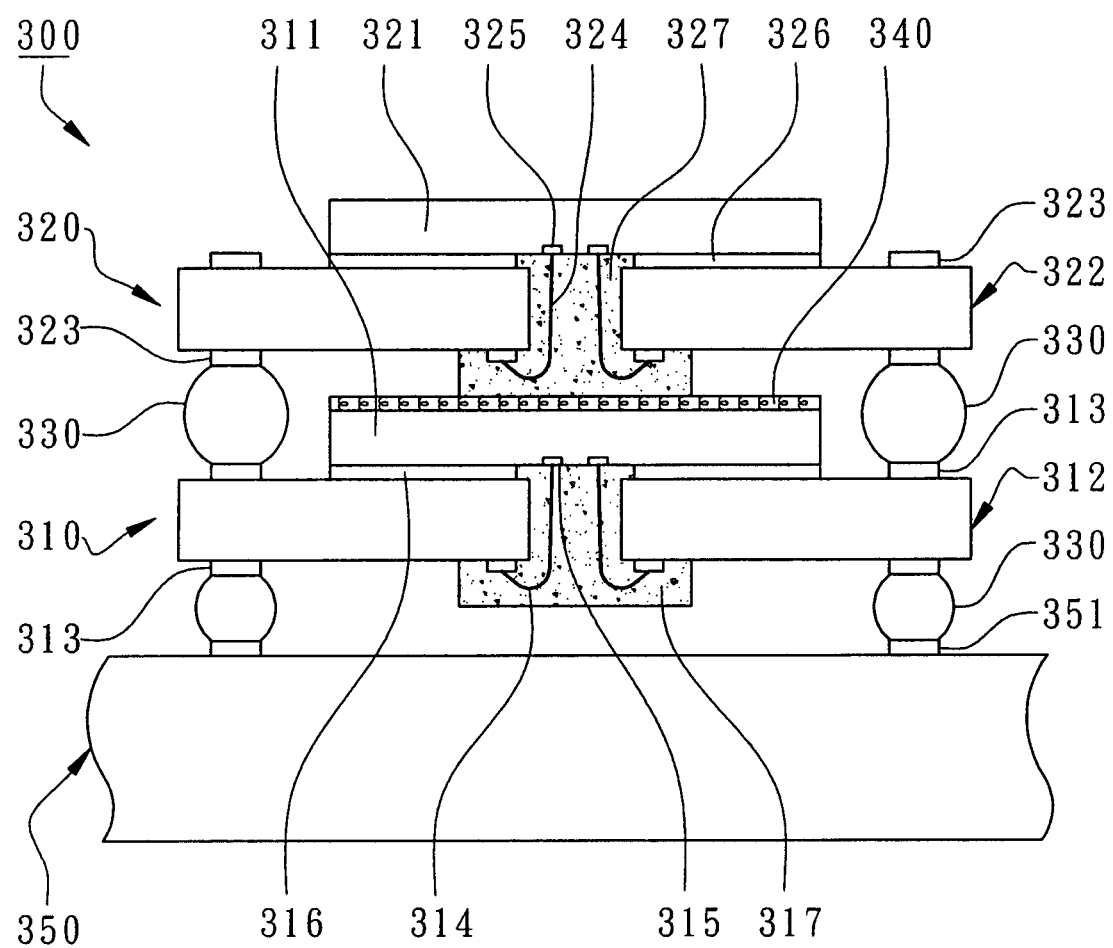
FIG. 5 shows a cross-sectional view of a semiconductor device having POP configuration according to the second embodiment of the present invention.

In the second embodiment of the present invention, as shown in FIG. 5, another semiconductor device 300 having package-on-package (POP) configuration is revealed, comprising a first semiconductor package 310, at least a second semiconductor package 320, and a plurality of electrical connecting components 330. The first semiconductor package 310 includes a first chip 311, a first substrate 312, and a plurality of first external terminals 313 where the first external terminals 313 are exposed from the sides of the first chip 311. The first substrate 312 is a multi-layer printed circuit board having a upper surface and a lower surface with electrically connecting structures between both surfaces. The first external terminals 313 are disposed on the upper surface and the lower surface of the first substrate 312 as electrical terminals for vertically stacked packages. In the present embodiment, the first external pads 313 are ball pads. The first semiconductor package 310 is electrically connected to the corresponding external ball pads 351 of a printed circuit board 350 by a plurality of solder balls 330.

In the present embodiment, the first chip 311 is disposed on and electrically connected to the first substrate 312. To be more specific, the active surface of the first chip 311 is attached to the upper surface of the first substrate 312 by a die-attaching material 316. Then the first bonding pads 315 of the first chip 311 are electrically connected to the inner fingers of the first substrate 312 by a plurality of first bonding wires 314. In the present embodiment, the first substrate 312 further has a wire-bonding slot for passing through the first bonding wires 314 to electrically connect the first chip 311 to the first substrate 312. The first semiconductor package 310 may further comprises a first encapsulant 317 formed by molding or dispensing inside the wire-bonding slot of the first substrate 312 and extruded from the lower surface of the first substrate 311 to encapsulate the first bonding wires 314.

The second semiconductor package 320 is vertically stacked on top of the first semiconductor package 310 to achieve high-density POP devices. The second semiconductor package 320 comprises a second chip 321, a second substrate 322, and a plurality of second external terminals 323 where the second external terminals 323 are exposed from the sides of the second chip 321. The second external terminals 323 can be selected from a group consisting of external leads of a leadframe, fingers of a flexible printed circuit, and external pads of a printed circuit board. However, the first external terminals 313 can be the same or not the same as the second external terminals 323. In the present embodiment, the second external terminals 323 are the ball pads on the second substrate 322 for vertical stacking semiconductor packages.

The package types of the second semiconductor package 320 can be the same or not the same as the first semiconductor package 310. In the present embodiment, the second semiconductor package 320 is the same as the first semiconductor package 310. The second chip 321 is disposed on and electrically connected to the second substrate 322. To be more specific, the active surface of the second chip 321 is attached to the upper surface of the second substrate 322 by a die-attaching material 326. Then, the second bonding pads 325 of the second chip 321 are electrically connected to the inner fingers of the substrate 322 by a plurality of bonding wires 324. In the present embodiment, the second substrate 322 has a wire-bonding slot for passing through the second bonding wires 324. The second semiconductor package 320 may further comprise a second encapsulant 327 formed by molding or dispensing inside the wire-bonding slot of the second substrate 322 and extruded from the lower surface of the second substrate 322 to encapsulate the second bonding wires 324.

The second external terminals 323 are electrically connected to the corresponding first electrical terminals 313 by the electrical connecting components 330 where the electrical connecting components 330 can be selected from a group consisting of intermetallic bonding layers, solder paste, solder balls, conductive columns, ACF (Anisotropic Conductive Film), and NCP (Non-Conductive Paste). In the present embodiment, the electrical connecting components 330 are solder balls. To be more specific, there is a flexible gap formed between first semiconductor package 310 and the second semiconductor package 320 in a manner that the second chip 321 is movable with respect to the electrical connecting components 330 to absorb and disperse the stresses between the vertically stacked semiconductor packages 310 and 320.

In the present embodiment, the flexible gap can be formed by disposing a stress-released layer 340 interposed between the first semiconductor package 310 and the second semiconductor package 320. In the present embodiment, the lower surface of the stress-releasing layer 340 is attached to the exposed back surface of the first chip 311 and the upper surface of the stress-releasing layer 340 is attached to the bottom of the second encapsulant 327 or to the lower surface of the second substrate 322. To be more specific, the stress-releasing layer 340 is made of low modulus material to absorb the stresses between the first semiconductor package 310 and the second semiconductor package 320, to disperse the stresses due to CTE mismatched or mechanical stress that exerted between the external terminals 313 and 323 and the electrical connecting components 330, and to avoid the breaks of the electrical connecting components 330 to enhance the reliability of the semiconductor device having package-on-package (POP) configuration, with movable external terminals 300.

Preferably, the thermal conductivity of the stress-releasing layer 340 is much higher than the ones of the first encapsulant 317 and the second encapsulant 327 to enhance heat dissipation and to evenly disperse the heat between the first semiconductor package 310 and the second semiconductor package 320.

The above description of embodiments of this invention is intended to be illustrative and not limiting. Other embodiments of this invention will be obvious to those skilled in the art in view of the above disclosure.

What is claimed:

1. A semiconductor device having package-on-package (POP) configuration, comprising:
   a first semiconductor package including a first encapsulant, at least a first chip encapsulated inside the first encapsulant, and a plurality of first external leads, wherein the first external leads are extended and exposed from at least one side of the first encapsulant;
   a second semiconductor package disposed above the first semiconductor package, the second semiconductor package including a second encapsulant, at least a second chip encapsulated inside the second encapsulant, and a plurality of second external leads, wherein the second external leads are extended and exposed from at least one side of the second encapsulant; and
   soldering materials soldering the second external leads to the corresponding first external leads, wherein the second encapsulant has a bottom surface movable with respect to the soldering materials on the second external leads and with respect to a top surface of the first encapsulant.

2. The semiconductor device as claimed in claim 1, further comprising a stress-releasing layer interposed between the first semiconductor package and the second semiconductor package, wherein the stress-releasing layer has a lower surface attached to the top surface of the first encapsulant and an upper surface attached to the bottom surface of the second encapsulant.

3. The semiconductor device as claimed in claim 2, wherein the stress-releasing layer is made of a low-modulus material to absorb the stresses between the first encapsulant and the second encapsulant.

4. The semiconductor device as claimed in claim 2, wherein the stress-releasing layer has a high thermal-conductivity.

5. The semiconductor device as claimed in claim 1, wherein the second external leads have a plurality of cut ends connected to a plurality of lead-shoulder sections of the corresponding first external leads by the soldering materials.

6. The semiconductor device as claimed in claim 1, wherein the second external leads have a plurality of cut ends and a plurality of inner surfaces adjacent to the cut ends, wherein the inner surfaces are connected to a plurality of lead-shoulder sections of the corresponding first external leads by the soldering materials.

7. A semiconductor device having package-on-package (POP) configuration, comprising:
   a first semiconductor package including a first chip and a plurality of first external terminals, wherein the first external terminals are exposed from the first chip;
   at least a second semiconductor package disposed above the first semiconductor package, the second semiconductor package including a second chip and a plurality of second external terminals, wherein the second external terminals are exposed from the second chip; and
   a plurality of electrical connecting components connecting the second external terminals to the corresponding first external terminals;
   wherein a flexible gap is formed between first semiconductor package and the second semiconductor package in a manner that the second chip is movable with respect to the electrical connecting components.

8. The semiconductor device as claimed in claim 7, further comprising a stress-releasing layer interposed between the first semiconductor package and the second semiconductor package to form the flexible gap.

9. The semiconductor device as claimed in claim 8, wherein the stress-releasing layer is made of a low-modulus material.

10. The semiconductor device as claimed in claim 8, wherein the stress-releasing layer has a high thermal-conductivity.

11. The semiconductor device as claimed in claim 7, wherein the second external terminals are selected from a group consisting of external leads of a leadframe, fingers of a flexible printed circuit, and external pads of a printed circuit board.

12. The semiconductor device as claimed in claim 11, wherein the first external terminals are the same as the second external terminals.

13. The semiconductor device as claimed in claim 7, wherein the electrical connecting components are selected from a group consisting of intermetallic bonding layer, solder paste, solder balls, conductive columns, ACF (Anisotropic Conductive Film), and NCP (Non-Conductive Paste).

* * * * *